United States Patent
Chowdhury et al.

(10) Patent No.: US 9,680,067 B2
(45) Date of Patent: Jun. 13, 2017

(54) HEAVILY PHOSPHOR LOADED LED PACKAGES HAVING HIGHER STABILITY

(71) Applicant: GE Lighting Solutions, LLC, East Cleveland, OH (US)

(72) Inventors: Ashfaqul Islam Chowdhury, Broadview Heights, OH (US); Gary Robert Allen, Euclid, OH (US); Dengke Cai, Willoughby, OH (US)

(73) Assignee: GE LIGHTING SOLUTIONS, LLC, East Cleveland, OH (US)

( * ) Notice: Subject to any disclaimer, the term of this patent is extended or adjusted under 35 U.S.C. 154(b) by 0 days.

(21) Appl. No.: 14/217,831

(22) Filed: Mar. 18, 2014

(65) Prior Publication Data

US 2015/0270451 A1  Sep. 24, 2015

(51) Int. Cl.
*H01L 21/00* (2006.01)
*H01L 33/00* (2010.01)
(Continued)

(52) U.S. Cl.
CPC .......... *H01L 33/504* (2013.01); *C09K 11/617* (2013.01); *C09K 11/7774* (2013.01); *H01L 33/501* (2013.01); *H01L 33/507* (2013.01); *H01L 33/56* (2013.01); *H01L 23/293* (2013.01); *H01L 23/3135* (2013.01);
(Continued)

(58) Field of Classification Search
CPC ......... H01L 33/20; H01L 33/32; H01L 33/38; H01L 33/44; H01L 33/54; H01L 33/56; H01L 33/486; H01L 33/60; H01L 33/62; H01L 2224/16; H01L 2224/48091; H01L 2224/48247; H01L 2224/73203; H01L 25/0753; H01L 2924/01005; H01L 2924/01013; H01L 2924/01029; H01L 2924/01078; H01L 2924/01079; H01L 2924/14; H01L 2924/15311; H01L 2924/19041; H01L 23/293; H01L 23/295; H01L 23/3135; H01L 21/563; H01L 2933/0041; H01L 2933/005; H01L 33/501; H01L 33/504; H01L 33/507;
(Continued)

(56) References Cited

U.S. PATENT DOCUMENTS 5,998,925 A * 12/1999 Shimizu et al. ............. 313/503
6,590,235 B2    7/2003 Carey
(Continued)

FOREIGN PATENT DOCUMENTS

DE    102004052902 A1    6/2005
EP       0890996 A2       1/1999
(Continued)

OTHER PUBLICATIONS

Bit Tie Chan, "Phosphor Film Conversion for White LEDS"; Feb. 4, 2011 Convergence Promotions LLC ; Digi-Key Corporation.
(Continued)

*Primary Examiner* — Teresa M Arroyo
(74) *Attorney, Agent, or Firm* — GE Global Patent Operation; Peter T. DiMauro

(57) ABSTRACT

Heavily phosphor loaded LED packages having higher stability and a method for increasing the stability of heavily phosphor loaded LED packages. A silicone overlayer is provided on the phosphor silicone blend layer.

12 Claims, 1 Drawing Sheet

(51) Int. Cl.
  *H01L 23/29* (2006.01)
  *H01L 33/50* (2010.01)
  *H01L 33/56* (2010.01)
  *C09K 11/61* (2006.01)
  *C09K 11/77* (2006.01)
  *H01L 33/48* (2010.01)
  *H05K 3/28* (2006.01)
  *H01L 23/31* (2006.01)

(52) U.S. Cl.
  CPC .......... *H01L 33/483* (2013.01); *H01L 33/505* (2013.01); *H01L 33/508* (2013.01); *H01L 2933/005* (2013.01); *H01L 2933/0041* (2013.01); *H05K 3/284* (2013.01)

(58) Field of Classification Search
  CPC ... H01L 33/508; H01L 33/483; H01L 33/505; H05K 3/284; C09K 11/617; C09K 11/7774
  USPC ... 257/98, 99, 100, 678, 787, 788, 789, 790, 257/791, 795; 438/27
  See application file for complete search history.

(56) References Cited

U.S. PATENT DOCUMENTS

| | | | |
|---|---|---|---|
| 7,026,756 B2* | 4/2006 | Shimizu et al. | 313/503 |
| 7,497,973 B2* | 3/2009 | Radkov et al. | 252/301.4 H |
| 7,521,728 B2 | 4/2009 | Andrews | |
| 8,252,613 B1 | 8/2012 | Lyons et al. | |
| 8,841,689 B2* | 9/2014 | Kashiwagi et al. | 257/98 |
| 9,018,661 B2 | 4/2015 | Pindl et al. | |
| 2004/0104391 A1 | 6/2004 | Maeda et al. | |
| 2007/0241666 A1 | 10/2007 | Jang et al. | |
| 2009/0140630 A1* | 6/2009 | Kijima et al. | 313/498 |
| 2009/0272996 A1* | 11/2009 | Chakraborty | 257/98 |
| 2010/0091215 A1 | 4/2010 | Fukunaga et al. | |
| 2010/0110659 A1 | 5/2010 | Nakajima | |
| 2010/0142189 A1 | 6/2010 | Hong et al. | |
| 2010/0200874 A1* | 8/2010 | Shioi et al. | 257/91 |
| 2010/0230693 A1 | 9/2010 | Tran | |
| 2010/0230708 A1 | 9/2010 | Tran | |
| 2010/0276712 A1* | 11/2010 | Shaikevitch et al. | 257/98 |
| 2011/0031516 A1 | 2/2011 | Basin et al. | |
| 2012/0043573 A1* | 2/2012 | Mitsuishi et al. | 257/98 |
| 2012/0235169 A1 | 9/2012 | Seko et al. | |
| 2012/0241797 A1 | 9/2012 | Kim et al. | |
| 2013/0082289 A1 | 4/2013 | Sakuta et al. | |
| 2013/0200413 A1* | 8/2013 | Kashiwagi et al. | 257/98 |
| 2013/0277694 A1 | 10/2013 | Sakuta et al. | |
| 2013/0334558 A1 | 12/2013 | Pindl et al. | |
| 2014/0175492 A1* | 6/2014 | Steranka et al. | 257/98 |
| 2014/0291715 A1 | 10/2014 | Reiherzer et al. | |
| 2015/0270451 A1 | 9/2015 | Chowdhury et al. | |

FOREIGN PATENT DOCUMENTS

| | | |
|---|---|---|
| EP | 2629341 A1 | 8/2013 |
| JP | 2010251621 A | 11/2010 |
| WO | 2012084516 A1 | 6/2012 |
| WO | 2012107263 A2 | 8/2012 |
| WO | 2013023971 A1 | 2/2013 |
| WO | 2013174977 A1 | 11/2013 |
| WO | 2014016214 A1 | 1/2014 |

OTHER PUBLICATIONS

International Search Report and Written Opinion issued in connection with corresponding PCT Application No. PCT/US2015/017010 dated Apr. 30, 2015.

US Non-Final Office Action issued in connection with corresponding U.S. Appl. No. 14/217,873 on Jan. 4, 2016.

PCT Search Report and Written Opinion issued in connection with related Application No. PCT/US2015/014056 on Apr. 15, 2015.

US Non-Final Office Action issued in connection with related U.S. Appl. No. 14/217,873 on Jun. 9, 2016.

Ashfaqul Islam Chowdhury et al., filed Mar. 18, 2014, U.S. Appl. No. 14/217,873.

* cited by examiner

HEAVILY PHOSPHOR LOADED LED PACKAGES HAVING HIGHER STABILITY

FIELD OF THE INVENTION

The present disclosure relates generally to light emitting diodes (LEDs) that are phosphor loaded. More particularly, the present disclosure relates to heavily phosphor loaded LED packages having higher stability and a method for increasing the stability of heavily phosphor loaded LED packages.

BACKGROUND OF THE INVENTION

LEDs are semiconductor light emitters often used as replacements for other light sources, such as incandescent lamps. They are particularly useful as illumination sources in applications where discretized or highly concentrated light is desired. The color of light produced by an LED package is dependent on the type of semiconducting material used in its manufacture and, where a phosphor system is used, the phosphor blend that is used.

Colored semiconductor LEDs, including light emitting diodes and lasers (both are generally referred to herein as LEDs), have been produced from Group III-V alloys such as gallium nitride (GaN). With reference to the GaN-based LEDs, light is generally emitted in the UV to green range of the electromagnetic spectrum. Until more recently, LEDs have not been suitable for lighting uses where a bright white light is needed, due to the inherent color of the light produced by the LED.

Phosphors convert radiation (energy) to visible light. Different combinations of phosphors provide different colored light emissions. The color of the generated visible light is dependent on the particular components of the phosphor material. The phosphor material may include only a single phosphor composition or two or more phosphors of basic color, for example a particular mix with one or more of a yellow and red phosphor to emit a desired color (tint) of light. As used herein, the terms "phosphor" and "phosphor material" may be used to denote both a single phosphor composition as well as a blend of two or more phosphor compositions.

In typical applications where "white" light is desired, phosphors are used in conjunction with LEDs to provide an acceptable net emission spectrum of desired characteristics. "White" light is typically defined as being close to the black body locus in color in regions of Correlated Color Temperatures (CCT) of 2500K to 6000K. For example, in a typical luminaire application, LEDs made from InGaN (Indium Gallium Nitride) that emit in the blue region of the electromagnetic spectrum are used in conjunction with yellow, green, and red phosphors to provide composite spectral outputs ranging from about 2500 K CCT to above 6000 K CCT. The resultant color temperature and color point in the CIE tristimulus plot depends on the output spectral power and wavelength of the diode emitter, the blend ratio, conversation characteristics, and amounts of phosphors used.

U.S. Pat. No. 7,497,973 discloses LEDs including a semiconductor light source and a phosphor material including a complex phosphor activated with $Mn^{4+}$. The particular phosphor material is $K_2[SiF_6]:Mn^{4+}$ (potassium fluoride silicon or PFS).

Another LED uses a combination of the PFS phosphor and the phosphor BSY (blue-shifted Yttrium Aluminum Garnet (YAG)). This combination is called BSY-PFS and it yields a white light. One preferred embodiment of an LED package using a BSY-PFS combination is a mid-power LED package (<1 W), used as an exemplary embodiment herein. The package has been fabricated using Nichia Mint Phosphor (BSY) and GE PFS phosphor in a Nichia 757 package. The usage of garnet phosphors in white LEDs is covered under U.S. Pat. Nos. 5,998,925 and 7,026,756. To those skilled in the art it will be evident that the implementation of the inventive elements is not limited to the Nichia 757. The invention can be implemented in a number of different LED packages where PFS is used in conjunction with a BSY phosphor or a spectrally similar phosphor.

Accordingly, the use of phosphors in LED packages provides advantages and is common. However, in general, LED packages that include PFS phosphors exhibit long term color and lumen stability issues. For example, the color requirement of the BSY-PFS system at 4000K Hi CRI (color rendering index) necessitates very high phosphor loading of the silicone/phosphor disk/mold. In reliability tests in the presence of humidity, the resulting visible radiation from the energized LED packages shift color. Mainly the red component of the spectral power distribution loses intensity gradually over operating time. The high phosphor loading also results in side wall "trench" formations and other effects that result in net color point shift.

The above-described shortcomings significantly limit the usefulness of PSF LEDs such as the BSY-PSF LED. Therefore, it would be useful to have LED package level improvements that mitigate color instability issues.

This invention relates to improving the stability of LED packages using PFS phosphor. Generally in such packages the phosphor loading is high as mentioned above. High loading in this context refers to phosphor to silicone weight ratios of 20% and higher.

SUMMARY OF THE INVENTION

In at least one aspect, the present disclosure provides a heavily phosphor loaded LED package having higher stability. Preferably the LED package is a low to medium power LED. One exemplary embodiment is the Nichia 757 mid power LED package, which is highly loaded with a BSY-PFS phosphor blend. The phosphor blend is overlayed with a silicone overlayer which protects the phosphor and provides an improvement in color shift.

In another embodiment, the invention provides a method to improve the long term stability and reliability of LED packages that employ PFS phosphor systems. In the method, a silicone over layer is provided on top of the silicone/phosphor layer.

Figure 1:
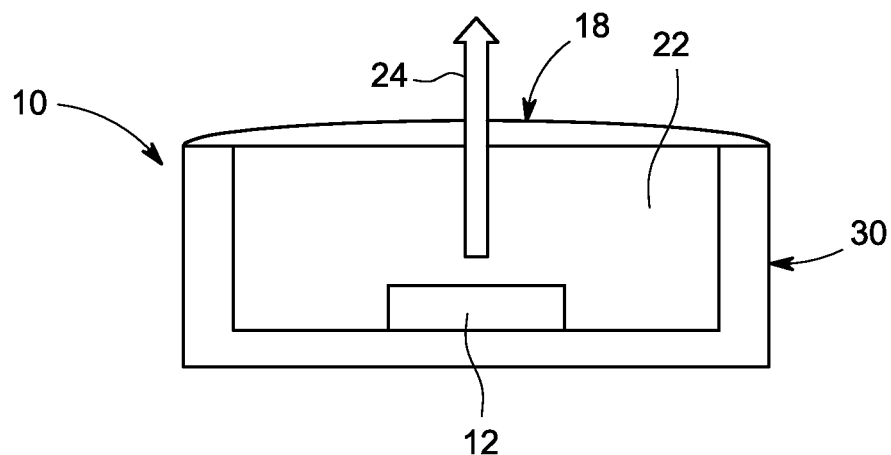
FIG. 1 illustrates a schematic view of an LED of the prior art.

The present disclosure may take form in various components and arrangements of components, and in various process operations and arrangements of process operations. The present disclosure is illustrated in the accompanying drawings, throughout which like reference numerals may indicate corresponding or similar parts in the various figures. The drawings are only for purposes of illustrating preferred embodiments and are not to be construed as limiting the disclosure. Given the following enabling description of the drawings, the novel aspects of the present disclosure should become evident to a person of ordinary skill in the art.

DETAILED DESCRIPTION

The following detailed description is merely exemplary in nature and is not intended to limit the applications and uses disclosed herein. Further, there is no intention to be bound by any theory presented in the preceding background or summary or the following detailed description. While embodiments of the present technology are described herein primarily in connection with PFS LED packages, and especially the Nichia 757 BSY-PFS LED package, the concepts are also applicable to other types of phosphor loaded LEDs and especially with other types of heavily phosphor loaded LEDs. Specifically, the concepts are most applicable in LED packages where the phosphor to silicone weight ratio is high (20% and higher) and at least one of the phosphors exhibits sensitivity to ambient atmospheric constituents such as moisture.

FIG. 1 shows an exemplary prior art LED package 10. The package 10 comprises a light emitting diode (LED) chip 12. A phosphor and silicone blend layer 22 overlays the chip 12. The LED chip 12 and phosphor silicone blend layer 22 are encapsulated with a lens 18. The LED package 10 includes an outside enclosure 30.

The phosphor silicone blend layer 22 is radiationally coupled to the LED chip 12 in the direction indicated by arrow 24. Radiationally coupled means that the elements are associated with each other so that at least part of the radiation emitted from one is transmitted to the other.

Figure 2:
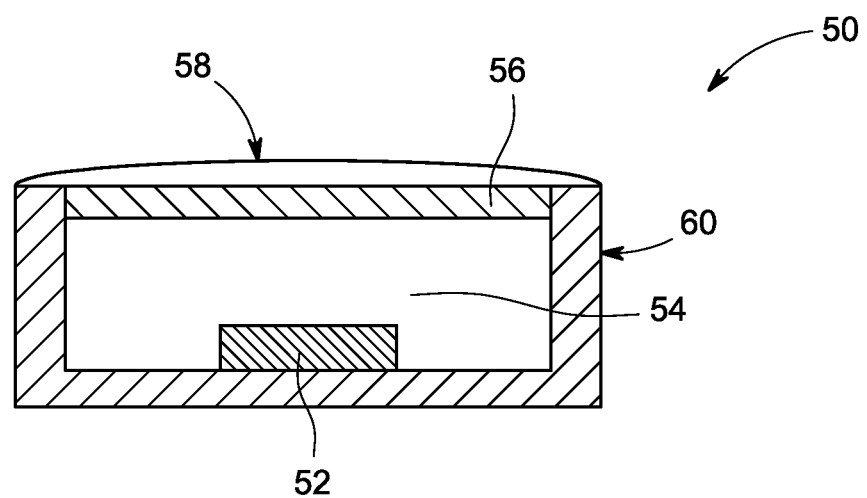
FIG. 2 illustrates an LED package with a silicone over layer.

One embodiment of a heavily phosphor loaded LED package 50 having greater stability is shown in FIG. 2. The package 50 comprises a semiconductor UV or visible radiation source, such as a light emitting diode (LED) chip 52. A phosphor and silicone blend layer 54 overlays the chip 52.

The package 50 may include any semiconductor visible or UV light source that is capable of producing white light when its emitted radiation is directed onto the phosphor. The preferred peak emission of the LED chip 52 will depend on the identity of the phosphors used and may range from, e.g., 250-550 nm. In one preferred embodiment, however, the emission of the LED will be in the violet to blue-green region and have a peak wavelength in the range from about 420 to about 500 nm. Typically then, the semiconductor light source comprises an LED doped with various impurities. Thus, the LED may comprise a semiconductor diode based on any suitable III-V, II-VI or IV-IV semiconductor layers and having a peak emission wavelength of about 250 to 550 nm.

Although the general discussion of the exemplary structures of the invention discussed herein are directed toward inorganic LED based light sources, it should be understood that the LED chip may be replaced by an organic light emissive structure or other radiation source unless otherwise noted and that any reference to LED chip or semiconductor is merely representative of any appropriate radiation source.

The phosphor silicone blend layer 54 is desirably heavily loaded with phosphor, especially 20% or greater by weight phosphor. The phosphor silicone blend layer 54 is generally about 0.2 mm in thickness. In preferred embodiments, the phosphor is a blend of PFS phosphor and BSY phosphor or a spectrally similar phosphor. Particularly preferred are the Nichia Mint phosphor (BSY) and GE PFS phosphor, desirably in a low to mid power LED package. An example is the Nichia 757 package.

A silicone overlayer 56 is provided on top of the phosphor silicone blend layer 54. The overlayer has a thickness of about 0.1 mm, desirably between about 0.1 and 0.5 mm. The silicone used is desirably the same type as than in the phosphor silicone blend layer 54.

The silicone over layer 56 is desirably applied or synthetically created from the blend immediately following dispensing of the silicone/phosphor slurry and subsequent simultaneous curing to avoid separation. In a preferred embodiment, prior to curing the silicone phosphor blend in the LED package, the silicone protective over layer 56 can be formed by gravitational settling of the phosphor in the silicone blend. The settling process can be aided by artificially creating additional gravitational force via a centrifuge or like device. This gravitational action physically settles a phosphor silicone blend layer 54 down on the LED chip 52 and allows silicone seepage to the top to form a silicone only protective overlayer 56.

The LED chip 52 and phosphor silicone blend layer 54 may be encapsulated with a lens 58. The lens 58 may be, for example, an epoxy, plastic, low temperature glass, polymer, thermoplastic, thermoset material, resin, or other type of LED encapsulating material as is known in the art. Optionally, the lens 58 is a spin-on glass or some other material having a high index of refraction. In one preferred embodiment, the lens 58 is a polymer material, such as epoxy, silicone, or silicone epoxy, although other organic or inorganic encapsulants may be used.

The lens 58 is preferably transparent or substantially optically transmissive with respect to the wavelength of light produced by the LED chip 52 and phosphor silicone blend material 54. In an alternate embodiment, the package 50 may only comprise an encapsulant material without an outer lens.

The outside enclosure 60 of the LED package is typically made of polymeric composite material EMC (Epoxy Moldable Compound). The LED chip 52 may be supported, for example, by a lead frame (not shown), by the self-supporting electrodes, the bottom of the enclosure 60, or by a pedestal (not shown) mounted to the shell or to the lead frame. The LED chip 52 is electrically attached to electrical contacts at the bottom surface of the outside enclosure 60. It is known to those skilled in the art that there could be multiple chips present in LED packages that have similar functional attributes.

The silicone overlayer 56 has been quantified to provide about a 25% improvement in package color shift as compared to the same LED package without the silicone overlayer due to its protection of the phosphor and isolation from ambient constituents such as water.

Example

Nichia 757 LEDs with high BSY-PFS phosphor loading (weight proportion Silicone:PFS:BSY of 49:40:11) were made with and without a silicone overlayer and compared under controlled operating conditions. In both cases the amount of phosphor used was the same and the LED drive and ambient conditions were kept the same. The LED operating conditions were 30 mA in a 47 C constant temperature chamber.

Table 1 below shows the relative improvement in color shift.

TABLE 1

| | Color Shift in MPCD After Hours of Operation | | | | |
|---|---|---|---|---|---|
| Hours of operation | 500 | 1000 | 2000 | 3000 | 4000 |
| With silicone overlayer | 0.51 | 0.64 | 0.7 | 0.8 | 0.9 |
| Without silicone overlayer | 0.77 | 0.81 | 0.8 | 0.94 | 1.26 |

The improvement in color shift after 500 hours of operation was 34% and after 4000 hours of operation was 29%.

Alternative embodiments, examples, and modifications which would still be encompassed by the disclosure may be made by those skilled in the art, particularly in light of the foregoing teachings. Further, it should be understood that the terminology used to describe the disclosure is intended to be in the nature of words of description rather than of limitation.

Those skilled in the art will also appreciate that various adaptations and modifications of the preferred and alternative embodiments described above can be configured without departing from the scope and spirit of the disclosure. Therefore, it is to be understood that, within the scope of the appended claims, the disclosure may be practiced other than as specifically described herein.

The invention claimed is:

1. A phosphor-loaded LED package comprising:
    an LED;
    a first layer comprising a gravitationally settled blend of phosphor and silicone overlaying the LED, wherein the blend comprises a phosphor to silicone weight ratio of at least 20%, and wherein the blend comprises at least $K_2SiF_6:Mn^{4+}$ (PFS) phosphor; and
    an overlayer comprising silicone, said overlayer which overlays the first layer, wherein the silicone overlayer has a thickness of about 0.1 mm or greater, and wherein the silicone overlayer is made of the same silicone as in the phosphor silicone blend.

2. The LED package of claim 1, wherein the PFS phosphor in the phosphor silicone blend exhibits sensitivity to ambient moisture.

3. The LED package of claim 1, wherein the phosphor silicone blend further includes BSY phosphor.

4. The LED package of claim 1, wherein the LED consumes low to mid power and the blend comprises a BSY-PFS phosphor.

5. The LED package of claim 1, wherein the phosphor silicone blend layer has a thickness of about 0.2 mm.

6. The LED package of claim 1, wherein the silicone overlayer has a thickness between about 0.1 mm and 0.5 mm.

7. A phosphor-loaded LED package comprising:
    an LED;
    a first layer comprising a blend of phosphor and silicone overlaying the LED, wherein the blend comprises a phosphor to silicone weight ratio of at least 20%, and wherein the blend comprises at least yttrium aluminum garnet (YAG) and $K_2SiF_6:Mn^{4+}$ (PFS) phosphor; and
    an overlayer comprising silicone, said overlayer which overlays the first layer.

8. The phosphor-loaded LED package of claim 7, wherein the silicone overlayer has a thickness of about 0.1 mm or greater.

9. The phosphor-loaded LED package of claim 7, wherein the phosphor silicone blend layer has a thickness of about 0.2 mm.

10. The phosphor-loaded LED package of claim 7, wherein the silicone overlayer has a thickness between about 0.1 mm and 0.5 mm.

11. The phosphor-loaded LED package of claim 7, wherein the silicone overlayer is made of the same silicone as in the phosphor silicone blend.

12. A phosphor-loaded LED package comprising:
    an LED;
    a first layer comprising a blend of phosphor and silicone overlaying the LED, wherein the blend comprises a phosphor to silicone weight ratio of at least 20%, and wherein the blend comprises at least $K_2SiF_6:Mn^{4+}$ (PFS) phosphor; and
    an overlayer comprising silicone, said overlayer which overlays the first layer, wherein the silicone overlayer has a thickness of about 0.1 mm or greater.

* * * * *